(12) United States Patent
Hao (10) Patent No.: US 10,707,104 B2
(45) Date of Patent: Jul. 7, 2020

(54) TAPE ATTACHING MACHINE AND TAPE REMOVING METHOD

(71) Applicant: DISCO CORPORATION, Tokyo (JP)

(72) Inventor: Yilong Hao, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 111 days.

(21) Appl. No.: 16/015,719

(22) Filed: Jun. 22, 2018

(65) Prior Publication Data

US 2019/0006210 A1 Jan. 3, 2019

(30) Foreign Application Priority Data

Jun. 28, 2017 (JP) .................................. 2017-126097

(51) Int. Cl.
| | |
|---|---|
| *B29C 65/00* | (2006.01) |
| *H01L 21/67* | (2006.01) |
| *H01L 21/683* | (2006.01) |
| *B29C 65/78* | (2006.01) |
| *B29C 65/50* | (2006.01) |
| *B29C 65/74* | (2006.01) |

(52) U.S. Cl.
CPC .... *H01L 21/67132* (2013.01); *H01L 21/6836* (2013.01); *B29C 65/50* (2013.01); *B29C 65/74* (2013.01); *B29C 65/741* (2013.01); *B29C 65/7832* (2013.01); *B29C 65/7891* (2013.01); *B29C 66/02241* (2013.01); *B29C 66/0326* (2013.01); *B29C 66/40* (2013.01); *B29C 66/45* (2013.01); *B29C 66/472* (2013.01); *B29C 66/83411* (2013.01); *H01L 2221/68327* (2013.01)

(58) Field of Classification Search
CPC ....... B29C 65/50; B29C 65/74; B29C 65/741; B29C 65/7832; B29C 65/7891; B29C 66/02241; B29C 66/0326; B29C 66/40; B29C 66/45; B29C 66/472; B29C 66/83411
USPC ....... 156/184, 250, 256, 267, 297, 302, 433, 156/502, 504, 510, 522
See application file for complete search history.

(56) References Cited

U.S. PATENT DOCUMENTS

| | | | | | |
|---|---|---|---|---|---|
| 4,925,515 | A | * | 5/1990 | Yoshimura | ........ H01L 21/67011 156/250 |
| 7,122,447 | B2 | * | 10/2006 | Abe | .................. H01L 21/67092 438/460 |

(Continued)

FOREIGN PATENT DOCUMENTS

JP 06177243 A 6/1994

*Primary Examiner* — Mark A Osele
*Assistant Examiner* — Nickolas R Harm
(74) *Attorney, Agent, or Firm* — Greer Burns & Crain, Ltd.

(57) ABSTRACT

A tape attaching machine for attaching an adhesive tape to a frame and a wafer and cutting the adhesive tape along the frame is provided. The tape attaching machine includes a tape winding unit configured to wind a remaining part of the adhesive tape left after cutting the adhesive tape, the remaining part of the adhesive tape being not attached to the frame and the wafer. The tape winding unit includes a main shaft like a roller and a pair of jigs detachably mounted on the opposite ends of the main shaft. Each of the jigs is engageable with the main shaft so as to have a tape contact area around which the remaining part of the adhesive tape is adapted to be wound and a grip area formed axially outside the tape contact area and adapted to be gripped by an operator.

6 Claims, 5 Drawing Sheets

(56) References Cited

U.S. PATENT DOCUMENTS

| | | | | |
|---|---|---|---|---|
| 7,503,365 B2* | 3/2009 | Ametani | ........... | H01L 21/67132 |
| | | | | 156/353 |
| 7,611,600 B2* | 11/2009 | Tsujimoto | ......... | H01L 21/67132 |
| | | | | 156/249 |
| 2003/0131929 A1* | 7/2003 | Yamamoto | ........ | H01L 21/67132 |
| | | | | 156/250 |
| 2004/0009650 A1* | 1/2004 | Jeong | ................ | H01L 21/67132 |
| | | | | 438/462 |
| 2009/0095426 A1* | 4/2009 | Yoshioka | .......... | H01L 21/67132 |
| | | | | 156/378 |

* cited by examiner

TAPE ATTACHING MACHINE AND TAPE REMOVING METHOD

BACKGROUND OF THE INVENTION

Field of the Invention

The present invention relates to a tape attaching machine for attaching an adhesive tape to a wafer and a ring frame and cutting the adhesive tape along the ring frame, and relates also to a tape removing method for removing the adhesive tape in the tape attaching machine after cutting the adhesive tape.

Description of the Related Art

In a semiconductor device manufacturing process, a wafer having a plurality of integrated circuits are divided into a plurality of chips, during which the wafer is supported through an adhesive tape to a ring frame, so as to prevent scattering of the chips, and any processing such as cutting is next performed to the wafer in the condition where the wafer is supported through the adhesive tape to the ring frame.

To unite the wafer and the ring frame through the adhesive tape, a tape attaching machine described in Japanese Patent Laid-Open No. Hei 6-177243, for example, may be used. This tape attaching machine includes a tape winding portion for winding a remaining part of the adhesive tape left after cutting the adhesive tape, this remaining part of the adhesive tape being not attached to the wafer and the ring frame. When the outer diameter of the roll of the remaining tape wound by the tape winding portion is increased, this roll of the remaining tape is removed from the tape winding portion by an operator.

SUMMARY OF THE INVENTION

In the tape attaching machine mentioned above, however, the remaining tape is wound around a shaft of the tape winding portion under tension in a stacked condition. Accordingly, it is not easy to remove the roll of the remaining tape from the tape winding portion. Conventionally, in removing the roll of the remaining tape, a cutter is used to make a slit in the roll of the remaining tape wound around the shaft of the tape winding portion, and the roll of the remaining tape is next removed from the shaft as starting from this slit. Thus, a troublesome operation is required in removing the roll of the remaining tape in the tape attaching machine.

It is therefore an object of the present invention to provide an improvement in which the roll of the remaining tape can be easily removed from the tape winding portion in the tape attaching machine.

In accordance with a first aspect of the present invention, there is provided a tape attaching machine including: a tape supply portion in which an adhesive tape is mounted in the form of a roll; a tape attaching movable roller for attaching the adhesive tape to a frame and a wafer; a tape cutter for cutting the adhesive tape along the frame; and a tape winding unit configured to wind a remaining part of the adhesive tape left after cutting the adhesive tape, the remaining part of the adhesive tape being not attached to the frame and the wafer. The tape winding unit includes: a main shaft like a roller; and a pair of jigs detachably mounted on the opposite ends of the main shaft; each of the jigs being engageable with the main shaft so as to have a tape contact area around which the remaining part of the adhesive tape is adapted to be wound and a grip area formed axially outside the tape contact area and adapted to be gripped by an operator, the tape contact area having a diameter larger than the diameter of the main shaft.

In accordance with a second aspect of the present invention, there is provided a tape attaching machine including: a tape supply portion in which an adhesive tape unit is mounted in the form of a roll, the adhesive tape unit including an adhesive tape having an adhesive surface and a release paper attached to the adhesive surface of the adhesive tape; a separating portion for separating the adhesive tape unit into the adhesive tape and the release paper; a release paper winding unit configured to wind the release paper; a tape attaching movable roller for attaching the adhesive tape to a frame and a wafer; a tape cutter for cutting the adhesive tape along the frame; and a tape winding unit configured to wind a remaining part of the adhesive tape left after cutting the adhesive tape, the remaining part of the adhesive tape being not attached to the frame and the wafer. The tape winding unit includes a first main shaft like a roller; and a pair of first jigs detachably mounted on the opposite ends of the first main shaft; each of the first jigs being engageable with the first main shaft so as to have a tape contact area around which the remaining part of the adhesive tape is adapted to be wound and a grip area formed axially outside the tape contact area and adapted to be gripped by an operator, the tape contact area having a diameter larger than the diameter of the first main shaft. The release paper winding unit includes a second main shaft like a roller; and a pair of second jigs detachably mounted on the opposite ends of the second main shaft; each of the second jigs being engageable with the second main shaft so as to have a release paper contact area around which the release paper is adapted to be wound and a grip area formed axially outside the release paper contact area and adapted to be gripped by the operator, the release paper contact area having a diameter larger than the diameter of the second main shaft.

Preferably, a slit is formed on the outer circumferential surface of each jig.

In accordance with a third aspect of the present invention, there is provided a tape removing method in the tape attaching machine according to the above first aspect of the present invention, including a jig removing step of removing at least one of the jigs engaged with the opposite ends of the main shaft from the main shaft, and a tape removing step of removing the roll of the remaining part of the adhesive tape wound around the main shaft from the main shaft after performing the jig removing step.

In the tape attaching machine according to the first aspect of the present invention, the two jigs are removably engaged with the opposite ends of the main shaft, and each jig has the tape contact area around which the remaining tape is adapted to be wound. Accordingly, when the remaining tape is wound around the main shaft in the condition where a laterally outer portion of the remaining tape is wound around the tape contact area of each jig, there is defined an annular spacing between the roll of the remaining tape and the outer circumferential surface of the main shaft because the diameter of the tape contact area is larger than the diameter of the main shaft. Accordingly, the roll of the remaining tape can be easily removed from the main shaft by gripping the grip area of each jig and next axially removing each jig from the gap between the roll of the remaining tape and the main shaft.

In the tape attaching machine according to the second aspect of the present invention, the two first jigs are removably engaged with the opposite ends of the first main shaft of the tape winding unit, and each first jig has the tape contact area around which the remaining tape is adapted to be wound. Accordingly, when the remaining tape is wound around the first main shaft in the condition where a laterally outer portion of the remaining tape is wound around the tape contact area of each first jig, there is defined an annular spacing between the roll of the remaining tape and the outer circumferential surface of the first main shaft because the diameter of the tape contact area is larger than the diameter of the first main shaft. Accordingly, the roll of the remaining tape can be easily removed from the first main shaft by gripping the grip area of each first jig and next axially removing each first jig from the gap between the roll of the remaining tape and the first main shaft. In addition, the two second jigs are removably engaged with the opposite ends of the second main shaft of the release paper winding unit, and each second jig has the release paper contact area around which the release paper is adapted to be wound. Accordingly, when the release paper is wound around the second main shaft in the condition where a laterally outer portion of the release paper is wound around the release paper contact area of each second jig, there is defined an annular spacing between the roll of the release paper and the outer circumferential surface of the second main shaft because the diameter of the release paper contact area is larger than the diameter of the second main shaft. Accordingly, the roll of the release paper can be easily removed from the second main shaft by gripping the grip area of each second jig and next axially removing each second jig from the gap between the roll of the release paper and the second main shaft.

In the case that the slit is formed on the outer circumferential surface of each jig, the inner diameter of each jig can be reduced by applying an external force to each jig, so that each jig can be easily separated from the remaining tape. Accordingly, each jig can be removed more easily from the gap between the main shaft and the roll of the remaining tape.

In the tape removing method according to the third aspect of the present invention, at least one of the two jigs engaged with the opposite ends of the main shaft in the tape attaching machine is first removed from the main shaft. Thereafter, the roll of the remaining tape wound around the main shaft is next removed from the main shaft. Owing to the presence of the annular spacing between the roll of the remaining tape and the outer circumferential surface of the main shaft, the roll of the remaining tape can be easily removed from the main shaft.

The above and other objects, features, and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Figure 1:
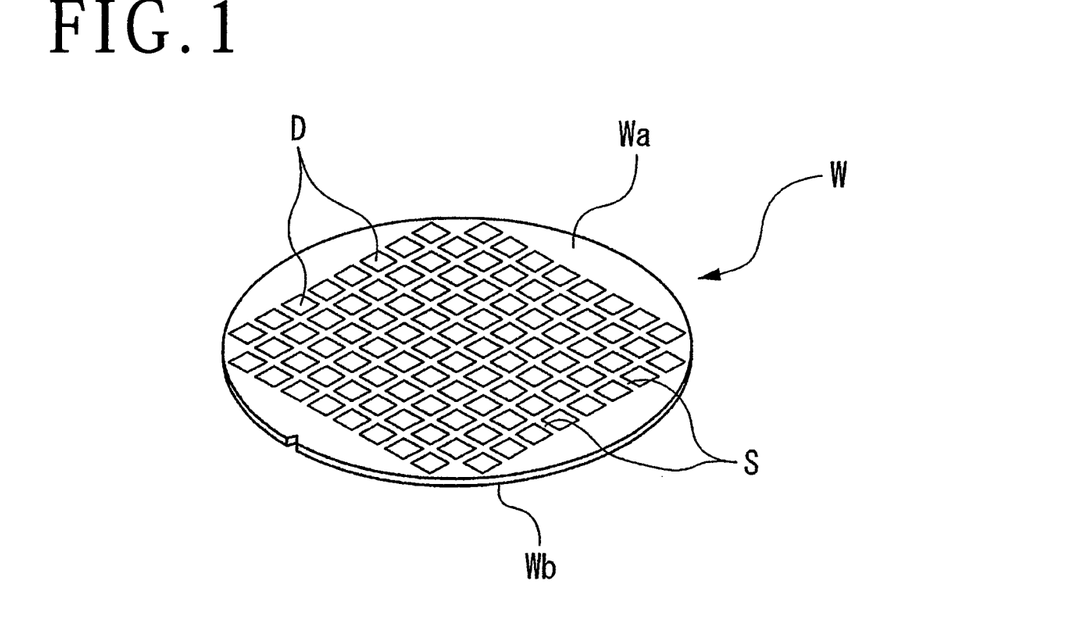
FIG. 1 is a perspective view of a wafer.
Figure 2:
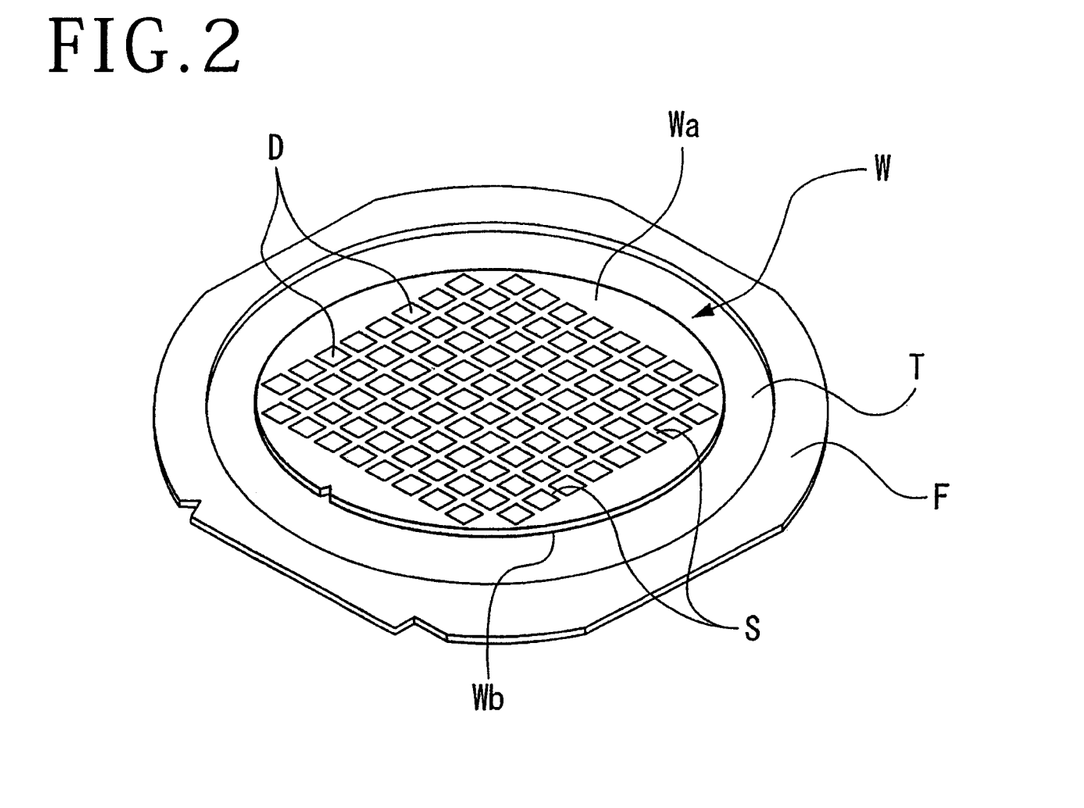
FIG. 2 is a perspective view depicting a condition where the wafer depicted in FIG. 1 is supported through an adhesive tape to a ring frame.

Referring to FIG. 1, there is depicted a wafer W as a workpiece. The wafer W is formed from a disk-shaped substrate. The wafer W has a front side Wa and a back side Wb opposite to the front side Wa. In FIG. 1, the front side Wa of the wafer W is depicted as an upper surface, and the back side Wb of the wafer W is depicted as a lower surface. A plurality of crossing division lines S are formed on the front side Wa of the wafer W to thereby define a plurality of separate regions where a plurality of devices D such as integrated circuits (ICs) and large scale integrated circuits (LSIs) are respectively formed. As depicted in FIG. 2, a circular adhesive tape T is attached at its central portion to the back side Wb of the wafer W, and a ring frame F is previously attached to a peripheral portion of the adhesive tape T. That is, the wafer W is supported through the adhesive tape T to the ring frame F. Any processing such as cutting is performed to the wafer W in the condition where the wafer W is supported through the adhesive tape T to the ring frame F.

1. First Preferred Embodiment (Tape Attaching Machine)

Figure 3:
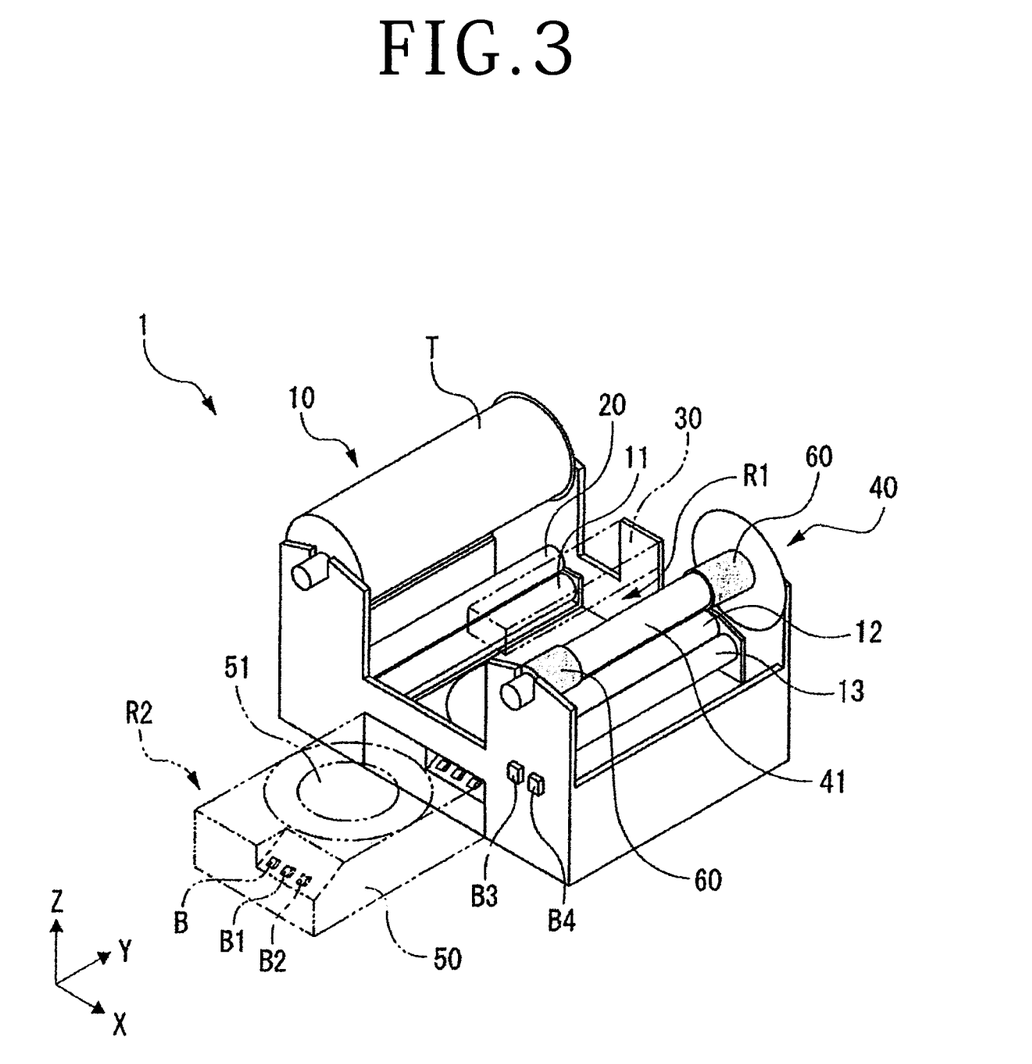
FIG. 3 is a perspective view depicting the configuration of a tape attaching machine according to a first preferred embodiment of the present invention.
Figure 4:
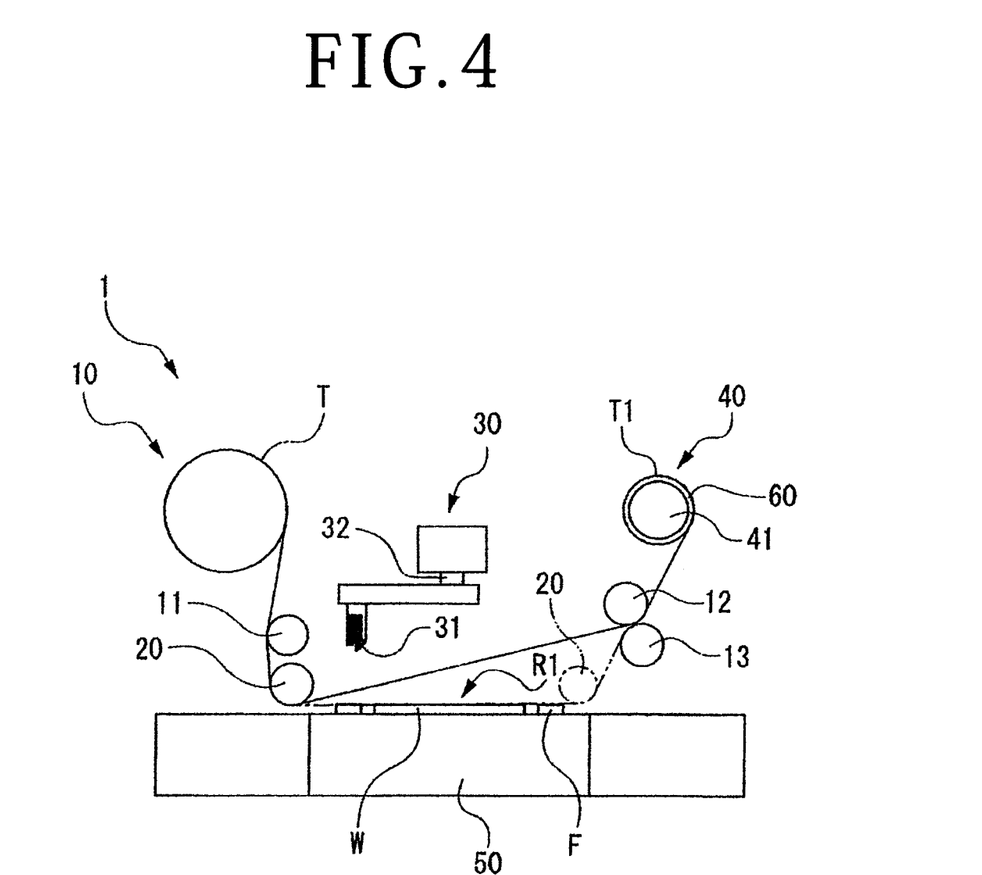
FIG. 4 is a side view of the tape attaching machine depicted in FIG. 3.

Referring to FIGS. 3 and 4, there is depicted a tape attaching machine 1 according to a first preferred embodiment of the present invention. The tape attaching machine 1 is a machine for attaching the adhesive tape T to the wafer W and the frame F, thereby uniting the wafer W, the adhesive tape T, and the frame F. The tape attaching machine 1 includes a tape supply portion 10 in which the adhesive tape T is mounted in the form of a roll, a tape attaching movable roller 20 for attaching the adhesive tape T to the frame F and the wafer W, a tape cutter 30 for cutting the adhesive tape T along the frame F, a tape winding unit 40 for winding a remaining part T1 of the adhesive tape T left after cutting the adhesive tape T, and a table 50 for holding the frame F and the wafer W. The remaining part T1 of the adhesive tape T is a part left after cutting the adhesive tape T by using the tape cutter 30, and this remaining part T1 is not attached to the frame F and the wafer W.

The table 50 has an upper surface as a wafer mounting surface 51 for mounting the wafer W and the frame F thereon in the condition where the wafer W is surrounded by the frame F as depicted in FIG. 2. The table 50 is movable in the Y direction depicted by an arrow Y in FIG. 3, between a tape attaching area R1 where the adhesive tape T is attached to the wafer W and the frame F and a wafer mounting/demounting area R2 where the wafer W and the frame F are mounted on the table 50 before attaching the adhesive tape T or the unit of the wafer W, the adhesive tape T, and the frame F is demounted from the table 50 after attaching the adhesive tape T.

A fixed roller 11 is provided between the tape supply portion 10 and the tape attaching movable roller 20. A pair of tape peeling movable rollers 12 and 13 are provided below the tape winding unit 40. The tape attaching movable roller 20 extends in the Y direction and it is movable in a horizontal direction (X direction) depicted by an arrow X in FIG. 3 as pressing the adhesive tape T against the frame F and the wafer W held on the table 50 set in the tape attaching area R1.

The tape cutter 30 is provided above the frame F and the wafer W held on the table 50 set in the tape attaching area R1. As depicted in FIG. 4, the tape cutter 30 includes a disk cutter edge 31 having a cutting point oriented downward and a rotating shaft 32 having a rotation axis extending in a vertical direction. The tape cutter 30 is vertically movable between a standby position where the tape cutter 30 is raised to wait for cutting of the adhesive tape T and a working position where the tape cutter 30 is lowered to cut the adhesive tape T. The disk cutter edge 31 of the tape cutter 30 is adapted to be rotated 360 degrees about the rotation axis of the rotating shaft 32 in the working position, thereby circularly cutting the adhesive tape T attached to the frame F and the wafer W held on the table 50 set in the tape attaching area R1.

Figure 5:
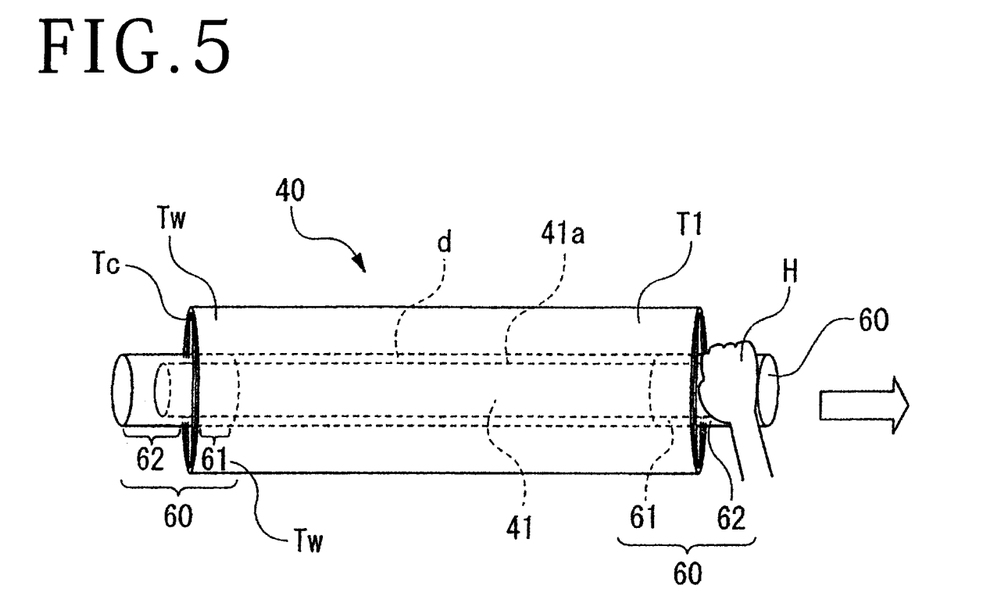
FIG. 5 is an elevational view depicting a jig removing step in a tape removing method according to the present invention.

The tape winding unit 40 includes a main shaft 41 like a roller and a pair of cylindrical jigs 60 detachably mounted on the opposite ends of the main shaft 41. As depicted in FIG. 5, each jig 60 is shorter in axial length than the main shaft 41 and has a central axial hole for axially receiving the main shaft 41. Each jig 60 is engageable with the main shaft 41 so as to have a tape contact area 61 having a diameter larger than the diameter of the main shaft 41 and a grip area 62 formed axially outside the tape contact area 61, i.e., the roll of the tape T1 (the remaining part T1 of the adhesive tape T). The tape T1 is wound around the main shaft 41 and the tape contact area 61, and the grip area 62 is adapted to be gripped by an operator's hand H, for example. More specifically, the tape contact area 61 is a part around which a laterally outer portion Tw of the tape T1 is wound, and the grip area 62 is a part projecting axially outward from a side edge Tc of the roll of the tape T1 wound around the main shaft 41 and the tape contact area 61. Accordingly, the grip area 62 of each jig 60 can be gripped by the operator's hand H, for example. The proportion of the range (axial length) between the tape contact area 61 and the grip area 62 is not especially limited, but may be arbitrary. Each jig 60 is formed of resin, for example. While a single jig 60 may be engaged with only one end of the main shaft 41, the pair of jigs 60 are preferably engaged with the opposite ends of the main shaft 41, so as to prevent the loss of the balance of the main shaft 41 to thereby well wind the tape T1 into a roll around the main shaft 41.

There will now be described a tape attaching operation by the tape attaching machine 1 configured above. First, the frame F and the wafer W are placed by the operator on the wafer mounting surface 51 of the table 50 set in the wafer mounting/demounting area R2 depicted by a phantom line in FIG. 3. Thereafter, a button B provided on the table 50 is depressed by the operator. As a result, the frame F and the wafer W are held on the wafer mounting surface 51 of the table 50 under suction, for example, and the table 50 is then moved to the tape attaching area R1. Accordingly, the frame F and the wafer W can be positioned in the tape attaching area R1 as depicted in FIG. 4.

After positioning the frame F and the wafer W in the tape attaching area R1, the tape attaching movable roller 20 is moved from the position depicted by a solid line to the position depicted by a phantom line in FIG. 4 as pressing the adhesive tape T against the frame F and the wafer W. Accordingly, the adhesive tape T can be attached to the frame F and the wafer W positioned in the tape attaching area R1. As required, the tape attaching movable roller 20 may be reciprocatedly moved. At this time, the tape cutter 30 is in the standby position. After attaching the adhesive tape T to the frame F and the wafer W, the tape cutter 30 is lowered to the working position and the cutting edge 31 is rotated about the axis of the rotating shaft 32 to thereby circularly cut the adhesive tape T along the frame F. After cutting the adhesive tape T, the tape cutter 30 is raised to the standby position.

Thereafter, the tape T1 as the remaining part of the adhesive tape T left after cutting the adhesive tape T is peeled from the frame F by upwardly moving the tape peeling movable rollers 12 and 13. Accordingly, the frame F and the wafer W are not attached to the tape T1. Thereafter, the tape T1 is wound around the main shaft 41 of the tape winding unit 40. In concert therewith, the adhesive tape T is newly supplied from the tape supply portion 10 to the tape attaching area R1.

At this time, the laterally outer portion Tw of the tape T1 is wound around the tape contact area 61 of each jig 60 engaged with each end of the main shaft 41 as depicted in FIG. 5. Accordingly, the inner diameter of the roll of the tape T1 wound around the main shaft 41 is larger than the diameter of the main shaft 41. In other words, an annular spacing d is defined between the tape T1 wound around the main shaft 41 and the outer circumferential surface 41*a* of the main shaft 41.

After attaching the adhesive tape T to the frame F and the wafer W, the table 50 depicted in FIG. 4 is moved from the tape attaching area R1 to the wafer mounting/demounting area R2 depicted in FIG. 3. Thereafter, the unit of the wafer W, the adhesive tape T, and the frame F is removed from the wafer mounting/demounting area R2 by the operator and next stored into a cassette (not depicted) or transferred to any working section for performing the next processing step. In this manner, the tape attaching operation for the wafer W and the frame F is finished. Thereafter, another new frame F and another new wafer W are mounted on the table 50 by the operator, and the tape attaching operation is similarly repeated.

(Tape Removing Method)

There will now be described a tape removing method for removing the tape T1 from the main shaft 41 in the tape attaching machine 1 mentioned above. When the tape attaching operation mentioned above is repeated, the outer diameter of the roll of the tape T1 wound around the main shaft 41 of the tape winding unit 40 is increased. Accordingly, the roll of the tape T1 is removed by the operator from the tape winding unit 40 with predetermined timing. First, the main shaft 41 and the roll of the tape T1 wound around the main shaft 41 are removed together from the tape attaching machine 1 by the operator.

(1) Jig Removing Step

As depicted in FIG. 5, the grip area 62 of at least one of the two jigs 60 engaged with the opposite ends of the main shaft 41 is gripped by the operator's hand H, and this jig 60 is then removed from the main shaft 41. Since each jig 60 is shorter in axial length than the main shaft 41, the grip area 62 of each jig 60 can be easily gripped by the operator's hand H and then axially removed from the main shaft 41 with a relatively small force. Further, each jig 60 can be reduced in diameter by the force applied from the operator, so that each jig 60 can be easily separated from the tape T1 (the inner circumferential surface of the roll of the tape T1). Accordingly, each jig 60 can be easily removed from the gap between the main shaft 41 and the tape T1.

(2) Tape Removing Step

Figure 6:
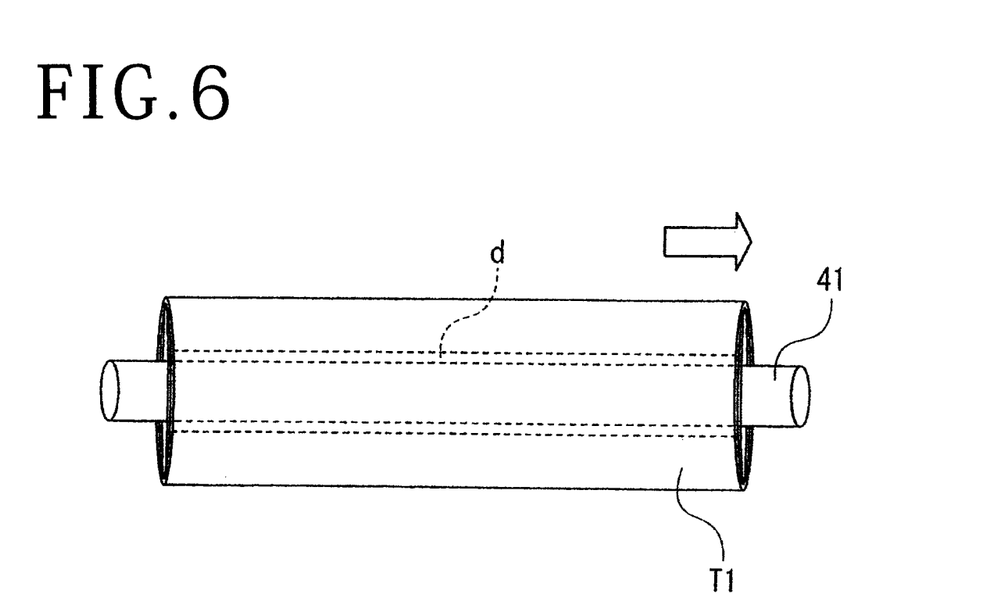
FIG. 6 is an elevational view depicting a tape removing step in the tape removing method.

After performing the jig removing step, the roll of the tape T1 wound around the main shaft 41 is removed from the main shaft 41 as depicted in FIG. 6. At this time, the roll of the tape T1 can be easily axially removed from the main shaft 41 because the annular spacing d is defined between the main shaft 41 and the roll of the tape T1.

As described above, in the tape attaching machine 1, the two jigs 60 are removably engaged with the opposite ends of the main shaft 41, and each jig 60 has the tape contact area 61 around which the tape T1 is adapted to be wound, the tape contact area 61 having a diameter larger than the diameter of the main shaft 41, and also has the grip area 62 formed axially outside the tape T1 and adapted to be gripped by the operator's hand H. Accordingly, when the laterally outer portion Tw of the tape T1 is wound around the tape contact area 61 of each jig 60, the annular spacing d is defined between the tape T1 (the inner circumferential surface of the roll of the tape T1 wound around the main shaft 41) and the outer circumferential surface 41a of the main shaft 41. Accordingly, each jig 60 can be easily removed from the gap between the tape T1 and the main shaft 41 by gripping the grip area 62 of each jig 60. Thereafter, the roll of the tape T1 can be easily removed from the main shaft 41 owing to the presence of the annular spacing d between the tape T1 and the main shaft 41.

Further, according to the tape removing method of the present invention as described above, at least one of the two jigs 60 engaged with the opposite ends of the main shaft 41 is first removed from the main shaft 41, and the roll of the tape T1 wound around the main shaft 41 is next removed from the main shaft 41. Accordingly, the roll of the tape T1 can be easily removed from the main shaft 41.

Figure 7A:
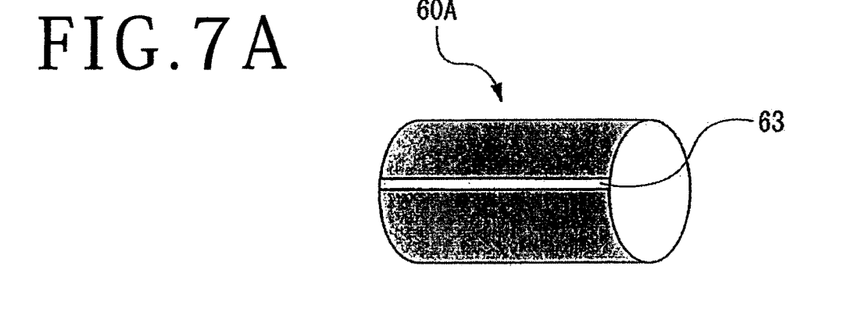
FIG. 7A is a perspective view depicting a first modification of each jig.

FIG. 7A depicts a cylindrical jig 60A as a first modification of each jig 60. As depicted in FIG. 7A, a slit 63 is formed on the outer circumferential surface of the jig 60A so as to extend in the axial direction of the jig 60A. By the formation of the slit 63, the outer diameter of the jig 60A can be easily reduced by applying an external force to the jig 60A, so that the jig 60A can be easily removed from the tape T1 (the inner circumferential surface of the roll of the tape T1). As a result, the jig 60A can be removed more easily from the gap between the main shaft 41 and the tape T1.

Figure 7B:
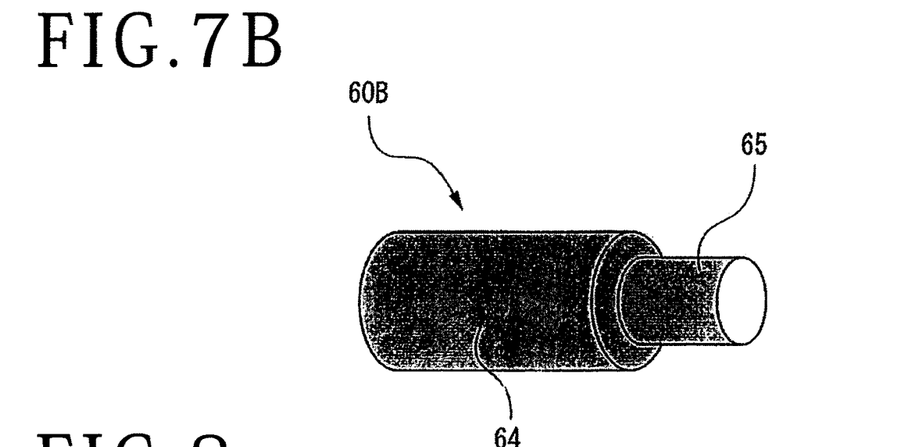
FIG. 7B is a perspective view depicting a second modification of each jig.

FIG. 7B depicts a cylindrical jig 60B as a second modification of each jig 60. As depicted in FIG. 7B, the jig 60B has a tape contact area 64 and a grip area 65 smaller in diameter than the tape contact area 64. By reducing the diameter of the grip area 65 as compared with the diameter of the tape contact area 64, the jig 60B can be easily gripped in the grip area 65. Accordingly, the jig 60B can be removed more easily from the gap between the main shaft 41 and the tape T1.

2. Second Preferred Embodiment (Tape Attaching Machine)

Figure 8:
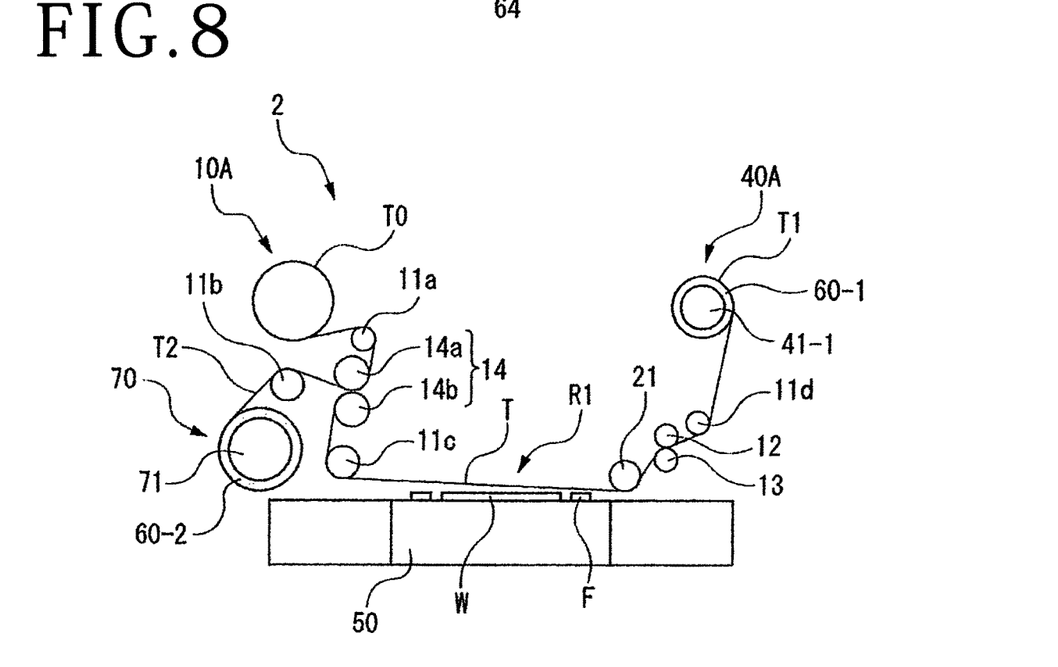
FIG. 8 is a side view depicting the configuration of a tape attaching machine according to a second preferred embodiment of the present invention.

Referring to FIG. 8, there is depicted a tape attaching machine 2 according to a second preferred embodiment of the present invention. The tape attaching machine 2 is a machine for attaching the adhesive tape T to the wafer W and the frame F after separating a release paper T2 from an adhesive tape unit T0. The adhesive tape unit T0 includes the adhesive tape T and the release paper T2 attached to the adhesive surface of the adhesive tape T. As depicted in FIG. 8, the tape attaching machine 2 includes a tape supply portion 10A in which the adhesive tape unit T0 is mounted in the form of a roll, a separating portion 14 for separating the adhesive tape unit T0 into the adhesive tape T and the release paper T2, a release paper winding unit 70 for winding the release paper T2, a tape attaching movable roller 21 for attaching the adhesive tape T to the frame F and the wafer W, a tape cutter (not depicted) for cutting the adhesive tape T along the frame F, and a tape winding unit 40A for winding a remaining part T1 of the adhesive tape T left after cutting the adhesive tape T. The remaining part T1 is not attached to the frame F and the wafer W.

A fixed roller 11a, the separating portion 14, and a fixed roller 11c are provided below the tape supply portion 10A. The separating portion 14 includes a pair of rollers 14a and 14b for separating the adhesive tape unit T0 into the adhesive tape T and the release paper T2. A fixed roller 11b is provided in the vicinity of the separating portion 14, so as to introduce the release paper T2 separated from the adhesive tape T by the rollers 14a and 14b to the release paper winding unit 70.

The tape winding unit 40A includes a first main shaft 41-1 like a roller and a pair of first cylindrical jigs 60-1 detachably mounted on the opposite ends of the first main shaft 41-1. The configuration of each first jig 60-1 is similar to the configuration of each jig 60 in the first preferred embodiment.

The release paper winding unit 70 includes a second main shaft 71 like a roller and a pair of second cylindrical jigs 60-2 detachably mounted on the opposite ends of the second main shaft 71. The configuration of each second jig 60-2 is similar to the configuration of each jig 60 in the first preferred embodiment with the exception that the size is different.

More specifically, each first jig 60-1 has a tape contact area similar to the tape contact area 61 of each jig 60 in the first preferred embodiment and a grip area similar to the grip area 62 of each jig 60 in the first preferred embodiment. Similarly, each second jig 60-2 has a release paper contact area corresponding to the tape contact area 61 of each jig 60 and a grip area corresponding to the grip area 62 of each jig 60.

In the tape attaching machine 2, the adhesive tape unit T0 is supplied from the tape supply portion 10A and next passed between the pair of rollers 14a and 14b, so that the adhesive tape unit T0 is separated into the adhesive tape T and the release paper T2. The release paper T2 is next introduced to the release paper winding unit 70 by the fixed roller 11b and then wound around the second main shaft 71 of the release paper winding unit 70. On the other hand, the adhesive tape T separated from the release paper T2 is guided by the fixed roller 11c to the tape attaching area R1, in which the adhesive tape T is next pressed against the wafer W and the frame F by the tape attaching movable roller 21 and thereby attached to the wafer W and the frame F set in the tape attaching area R1. Thereafter, the adhesive tape T is circularly cut along the frame F by the tape cutter (not depicted). Thereafter, the tape T1 left after cutting the adhesive tape T is peeled from the frame F by upwardly moving the tape peeling movable rollers 12 and 13, and the tape T1 is not attached to the frame F and the wafer W. Thereafter, the tape T1 is guided by a fixed roller 11d to the tape winding unit 40A and then wound around the first main shaft 41-1 of the tape winding unit 40A.

(Tape Removing Method)

A tape removing method in the tape attaching machine 2 mentioned above can be performed in a manner similar to that in the tape attaching machine 1. In the tape removing method according to the second preferred embodiment, the grip area of at least one of the two first jigs 60-1 engaged with the opposite ends of the first main shaft 41-1 is gripped by the operator's hand, and this first jig 60-1 is then removed from the first main shaft 41-1. Thereafter, the roll of the tape T1 wound around the first main shaft 41-1 can be removed from the first main shaft 41-1. At this time, the roll of the tape T1 can be easily removed from the first main shaft 41-1 because an annular spacing is defined between the first main shaft 41-1 and the roll of the tape T1 (between the outer circumferential surface of the first main shaft 41-1 and the inner circumferential surface of the roll of the tape T1).

Also in the release paper winding unit 70 of the tape attaching machine 2, the roll of the release paper T2 can be similarly removed from the second main shaft 71 in the following manner. That is, the grip area of at least one of the two second jigs 60-2 engaged with the opposite ends of the second main shaft 71 is gripped by the operator's hand, and this second jig 60-2 is then removed from the second main shaft 71. Thereafter, the roll of the release paper T2 wound around the second main shaft 71 can be removed from the second main shaft 71. At this time, the roll of the release paper T2 can be easily removed from the second main shaft 71 because an annular spacing is defined between the second main shaft 71 and the roll of the release paper T2 (between the outer circumferential surface of the second main shaft 71 and the inner circumferential surface of the roll of the release paper T2). While the tape winding unit 40A and the release paper winding unit 70 include the first jigs 60-1 and the second jigs 60-2, respectively, any one of the tape winding unit 40A and the release paper winding unit 70 may include the first or second jigs 60-1 or 60-2.

As described above, in the tape attaching machine 2, the two first jigs 60-1 are removably engaged with the opposite ends of the first main shaft 41-1 of the tape winding unit 40A, and each first jig 60-1 has the tape contact area around which the tape T1 is adapted to be wound. The tape contact area of each first jig 60-1 has a diameter larger than the diameter of the first main shaft 41-1, so that when the tape T1 is wound around the first main shaft 41-1 in the condition where a laterally outer portion of the tape T1 is wound around the tape contact area of each first jig 60-1, the annular spacing is defined between the roll of the tape T1 and the first main shaft 41-1 (between the inner circumferential surface of the roll of the tape T1 and the outer circumferential surface of the first main shaft 41-1). Accordingly, the roll of the tape T1 can be easily removed from the first main shaft 41-1 by gripping the grip area of each first jig 60-1 and then axially removing each first jig 60-1 from the gap between the tape T1 and the first main shaft 41-1.

Further, in the tape attaching machine 2, the two second jigs 60-2 are removably engaged with the opposite ends of the second main shaft 71 of the release paper winding unit 70, and each second jig 60-2 has the release paper contact area around which the release paper T2 is adapted to be wound. The release paper contact area of each second jig 60-2 has a diameter larger than the diameter of the second main shaft 71, so that when the release paper T2 is wound around the second main shaft 71 in the condition where a laterally outer portion of the release paper T2 is wound around the release paper contact area of each second jig 60-2, the annular spacing is defined between the roll of the release paper T2 and the second main shaft 71 (between the inner circumferential surface of the roll of the release paper T2 and the outer circumferential surface of the second main shaft 71). Accordingly, the roll of the release paper T2 can be easily removed from the second main shaft 71 by gripping the grip area of each second jig 60-2 and then axially removing each second jig 60-2 from the gap between the release paper T2 and the second main shaft 71.

The operator mentioned above is not limited to a person, but may be a robot or the like. Further, in the preferred embodiment depicted in FIG. 3, the tape attaching machine 1 is operated in such a manner that when the button B is depressed by the operator, the wafer W and the frame F mounted on the table 50 is held on the table 50 under suction and the table 50 is next automatically moved from the wafer mounting/demounting area R2 to the tape attaching area R1. This configuration is merely illustrative, and the setting of the tape attaching machine 1 depicted in FIG. 3 may be suitably changed in the following manner. For example, a button B1 may be used to hold the frame F and the wafer W on the table 50 under suction. A button B2 may be used to move the table 50 between the wafer mounting/demounting area R2 and the tape attaching area R1. A button B3 may be used to start the supply of the adhesive tape T from the tape supply portion 10. A button B4 may be used to start the driving of the tape attaching movable roller 20.

Further, while all of the jigs 60, 60A, and 60B, the first jigs 60-1, and the second jigs 60-2 are cylindrical in outside shape, the shape of each jig is not limited. For example, each jig may have an outside shape of polygonal prism such as triangular (trigonal) prism, quadrangular (tetragonal) prism, and pentagonal prism.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A tape attaching machine comprising:
    a tape supply portion in which an adhesive tape is mounted in the form of a roll;
    a tape attaching movable roller for attaching said adhesive tape to a frame and a wafer;
    a tape cutter for cutting said adhesive tape along said frame; and
    a tape winding unit configured to wind a remaining part of said adhesive tape left after cutting said adhesive tape, said remaining part of said adhesive tape being not attached to said frame and said wafer,
    said tape winding unit including:
        a main shaft; and
        a pair of jigs detachably mounted on opposite ends of said main shaft,
        each of said jigs being engageable with said main shaft, wherein each of said jigs includes a tape contact area around which said remaining part of said adhesive tape is adapted to be wound and a grip area formed axially outside said tape contact area and adapted to be gripped by an operator, said tape contact area having a diameter larger than a diameter of said main shaft.

2. The tape attaching machine according to claim 1, wherein a slit is formed on an outer circumferential surface of each jig.

3. A tape attaching machine comprising:
    a tape supply portion in which an adhesive tape unit is mounted in the form of a roll, said adhesive tape unit being composed of an adhesive tape having an adhesive surface and a release paper attached to said adhesive surface of said adhesive tape;

a separating portion for separating said adhesive tape unit into said adhesive tape and said release paper;

a release paper winding unit configured to wind said release paper;

a tape attaching movable roller for attaching said adhesive tape to a frame and a wafer;

a tape cutter for cutting said adhesive tape along said frame; and a tape winding unit configured to wind a remaining part of said adhesive tape left after cutting said adhesive tape, said remaining part of said adhesive tape being not attached to said frame and said wafer, said tape winding unit including:
  a first main shaft; and
  a pair of first jigs detachably mounted on opposite ends of said first main shaft,
  each of said first jigs being engageable with said first main shaft, wherein each of said first jigs includes a tape contact area around which said remaining part of said adhesive tape is adapted to be wound and a grip area formed axially outside said tape contact area and adapted to be gripped by an operator, said tape contact area having a diameter larger than a diameter of said first main shaft, said release paper winding unit including:
  a second main shaft; and
  a pair of second jigs detachably mounted on opposite ends of said second main shaft,
  each of said second jigs being engageable with said second main shaft, wherein each of said second jigs includes a release paper contact area around which said release paper is adapted to be wound and a grip area formed axially outside said release paper contact area and adapted to be gripped by said operator, said release paper contact area having a diameter larger than a diameter of said second main shaft.

4. The tape attaching machine according to claim 3, wherein a slit is formed on an outer circumferential surface of each of the pair of first jigs and/or the pair of second jigs.

5. A tape removing method in a tape attaching machine including:
  a tape supply portion in which an adhesive tape is mounted in a form of a roll;
  a tape attaching movable roller for attaching said adhesive tape to a frame and a wafer;
  a tape cutter for cutting said adhesive tape along said frame; and
  a tape winding unit configured to wind a remaining part of said adhesive tape left after cutting said adhesive tape, said remaining part of said adhesive tape being not attached to said frame and said wafer,
  said tape winding unit including:
    a main shaft; and
    a pair of jigs detachably mounted on opposite ends of said main shaft,
    each of said jigs being engageable with said main shaft, wherein each of said jigs includes a tape contact area around which said remaining part of said adhesive tape is adapted to be wound and a grip area formed axially outside said tape contact area and adapted to be gripped by an operator, said tape contact area having a diameter larger than a diameter of said main shaft,
  said tape removing method comprising:
    a jig removing step of removing at least one of said jigs engaged with the opposite ends of said main shaft from said main shaft; and
    a tape removing step of removing the roll of said remaining part of said adhesive tape wound around said main shaft from said main shaft after performing said jig removing step.

6. The tape removing method according to claim 5, wherein a slit is formed on an outer circumferential surface of each jig.

* * * * *